(12) United States Patent
Okada et al.

(10) Patent No.: US 8,482,091 B2
(45) Date of Patent: Jul. 9, 2013

(54) LIGHT RECEIVING ELEMENT

(75) Inventors: Norio Okada, Tokyo (JP); Masaharu Nakaji, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 517 days.

(21) Appl. No.: 12/542,961

(22) Filed: Aug. 18, 2009

(65) Prior Publication Data

US 2010/0059839 A1 Mar. 11, 2010

(30) Foreign Application Priority Data

Sep. 9, 2008 (JP) ................... 2008-231073

(51) Int. Cl.
*H01L 31/0232* (2006.01)

(52) U.S. Cl.
USPC .................................. 257/432; 257/E31.127

(58) Field of Classification Search
USPC .......................................... 257/432, E31.127
See application file for complete search history.

(56) References Cited

U.S. PATENT DOCUMENTS

| | | | | |
|---|---|---|---|---|
| 5,252,852 A * | 10/1993 | Makiuchi et al. | ............. | 257/458 |
| 2004/0056179 A1 * | 3/2004 | Wang et al. | ................ | 250/214.1 |
| 2004/0075154 A1 * | 4/2004 | Nakaji et al. | .................. | 257/458 |
| 2004/0202397 A1 * | 10/2004 | Hatta et al. | ......................... | 385/2 |
| 2006/0043518 A1 * | 3/2006 | Nakaji et al. | .................. | 257/458 |

FOREIGN PATENT DOCUMENTS

| JP | 7-312430 | | 11/1995 |
|---|---|---|---|
| JP | 2003197952 A | * | 7/2003 |
| JP | 2003-289149 | | 10/2003 |
| JP | 2003-332591 | | 11/2003 |
| JP | 2004-95869 | | 3/2004 |

OTHER PUBLICATIONS

Office Action issued Apr. 24, 2012, in Japanese Patent Application No. 2008-231073 with Partial English translation.

* cited by examiner

*Primary Examiner* — Matthew W Such
*Assistant Examiner* — Robert Carpenter
(74) *Attorney, Agent, or Firm* — Oblon, Spivak, McClelland, Maier & Neustadt, L.L.P.

(57) ABSTRACT

A light receiving element comprises: a photodiode including an optical waveguide, an end surface of the optical waveguide being a light receiving surface of the photodiode; a signal electrode and a bias electrode on a common surface of the photodiode, the signal electrode being connected to an anode of the photodiode, the bias electrode being connected to a cathode of the photodiode; an insulating film on the bias electrode; and a metal electrode on the insulating film.

3 Claims, 6 Drawing Sheets

COMPARATIVE ART

COMPARATIVE ART

;# LIGHT RECEIVING ELEMENT

BACKGROUND OF THE INVENTION

1. Field of the Invention

The present invention relates to a light receiving element whose bias electrode is connected to a bias electrode of an integrated circuit via a capacitor, and more particularly to a light receiving element which can shorten an electrical length between both so as to reduce a distortion of an electric field coupling caused by resonance.

2. Background Art

A light receiving element comprising an end surface light receiving type photodiode, a signal electrode, and a bias electrode has been known. The photodiode includes an optical waveguide. The end surface of the optical waveguide acts as a light receiving surface of the photodiode. The signal electrode and the bias electrode are formed on a common surface of the photodiode. The signal electrode is connected to an anode of the photodiode. The bias electrode is connected to a cathode of the photodiode (see, for example, FIG. 7 of Japanese Patent Laid-Open No. 2004-095869).

SUMMARY OF THE INVENTION

The bias electrode of the light receiving element is connected to a bias electrode of an integrated circuit formed in a later stage. However, in many cases, the bias electrode of the light receiving element is AC-GND and the bias electrode of the integrated circuit is DC-GND. Then, both can not be directly connected to each other. Consequently, both were connected to each other via a capacitor that is a different element. Therefore, there was a problem wherein an electrical length between both is enlarged so that an electric field coupling is distorted by resonance in the band, thereby the characteristics is deteriorated.

In view of the above-described problems, an object of the present invention is to provide a light receiving element which can reduce a distortion of an electric field coupling caused by resonance.

According to one aspect of the present invention, a light receiving element comprises: a photodiode including an optical waveguide, an end surface of the optical waveguide being a light receiving surface of the photodiode; a signal electrode and a bias electrode on a common surface of the photodiode, the signal electrode being connected to an anode of the photodiode, the bias electrode being connected to a cathode of the photodiode; an insulating film on the bias electrode; and a metal electrode on the insulating film.

The present invention can reduce a distortion of an electric field coupling caused by resonance.

Other and further objects, features and advantages of the invention will appear more fully from the following description.

DETAILED DESCRIPTION OF THE PREFERRED EMBODIMENTS

First Embodiment

Figure 1:
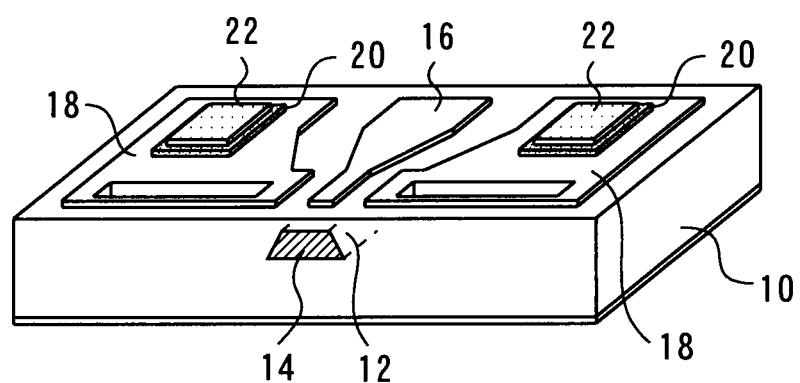
FIG. 1 is a perspective view showing a light receiving element according to a first embodiment of the present invention.

FIG. 1 is a perspective view showing a light receiving element according to a first embodiment of the present invention. A photodiode 10 is an end surface light receiving type photodiode. The photodiode 10 includes an optical waveguide 12. The end surface 14 of the optical waveguide 12 acts as a light receiving surface of the photodiode 10. A signal electrode 16 and a bias electrode 18 are formed on a common surface of the photodiode 10. The signal electrode 16 is connected to an anode of the photodiode 10. The bias electrode 18 is connected to a cathode of the photodiode 10. The bias electrode 18 functions as AC-GND for the signal electrode 16. The two electrodes are connected via electric field so as to form a coplanar line.

In the present embodiment, an insulating film 20 is formed on the bias electrode 18. A metal electrode 22 is formed on the insulating film 20. The insulating film 20 and the metal electrode 22 on the bias electrode 18 constitute a thin capacitor. A dielectric capacitance Cs of the capacitor is expressed by:

$$Cs = \epsilon \times \epsilon r \times S/d$$

where $\epsilon$ stands for a dielectric constant, $\epsilon r$ stands for a relative permittivity of the insulating film 20, S stands for an area of the metal electrode 22, and d stands for a thickness of the insulating film 20.

Figure 2:
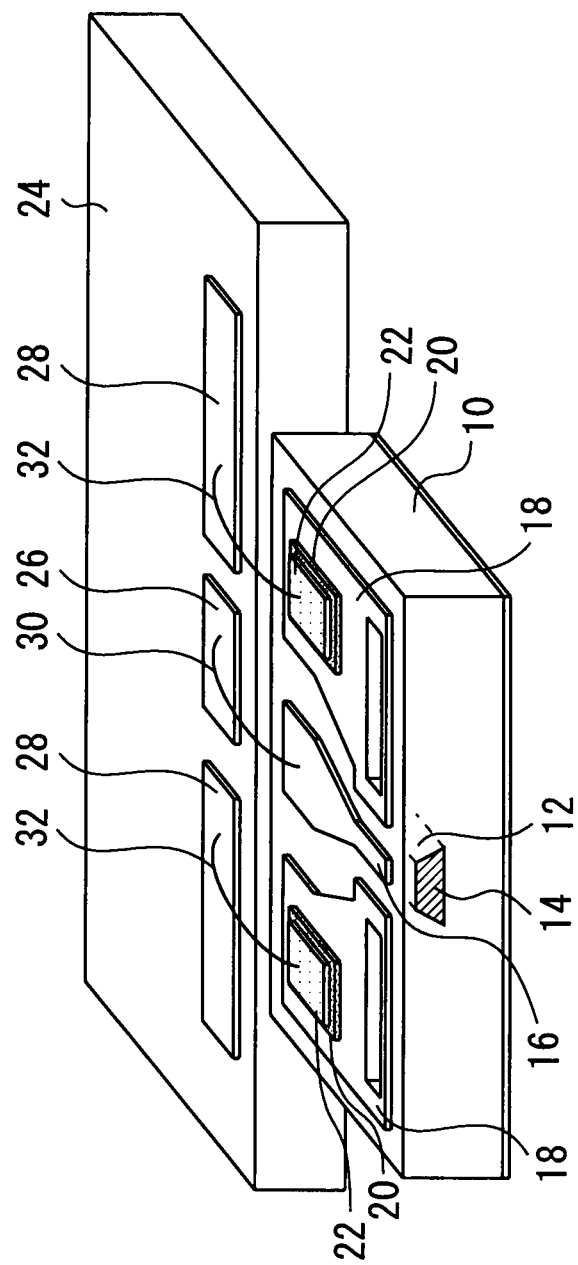
FIG. 2 is a perspective view showing a state where the light receiving element according to the first embodiment of the present invention is connected to an integrated circuit.

FIG. 2 is a perspective view showing a state where the light receiving element according to the first embodiment of the present invention is connected to an integrated circuit. A signal electrode 26 and a bias electrode 28 are formed on an upper surface of an integrated circuit 24. The bias electrode 28 functions as AC-GND for the signal electrode 26. It should be noted that the bias electrode 28 of the integrated circuit 24 side has an electric potential that is different from that of the bias electrode 18 of the photodiode 10 side.

The signal electrode 16 of the photodiode 10 side is connected to the signal electrode 26 of the integrated circuit 24 side via a wire 30. The metal electrode 22 of the photodiode 10 side is connected to the bias electrode 28 of the integrated circuit 24 side via a wire 32.

In the present embodiment, the bias electrode 18 of the photodiode 10 side and the bias electrode 28 of the integrated circuit 24 side are connected in a manner of an AC-coupling via a capacitor including the bias electrode 18, the insulating film 20, and the metal electrode 22. A return current flows through the bias electrode 18 of the photodiode 10 side. Only high-frequency components of the return current flow through the bias electrode 28 of the integrated circuit 24 side via the insulating film 20, the metal electrode 22, and the wire 32.

Figure 3:
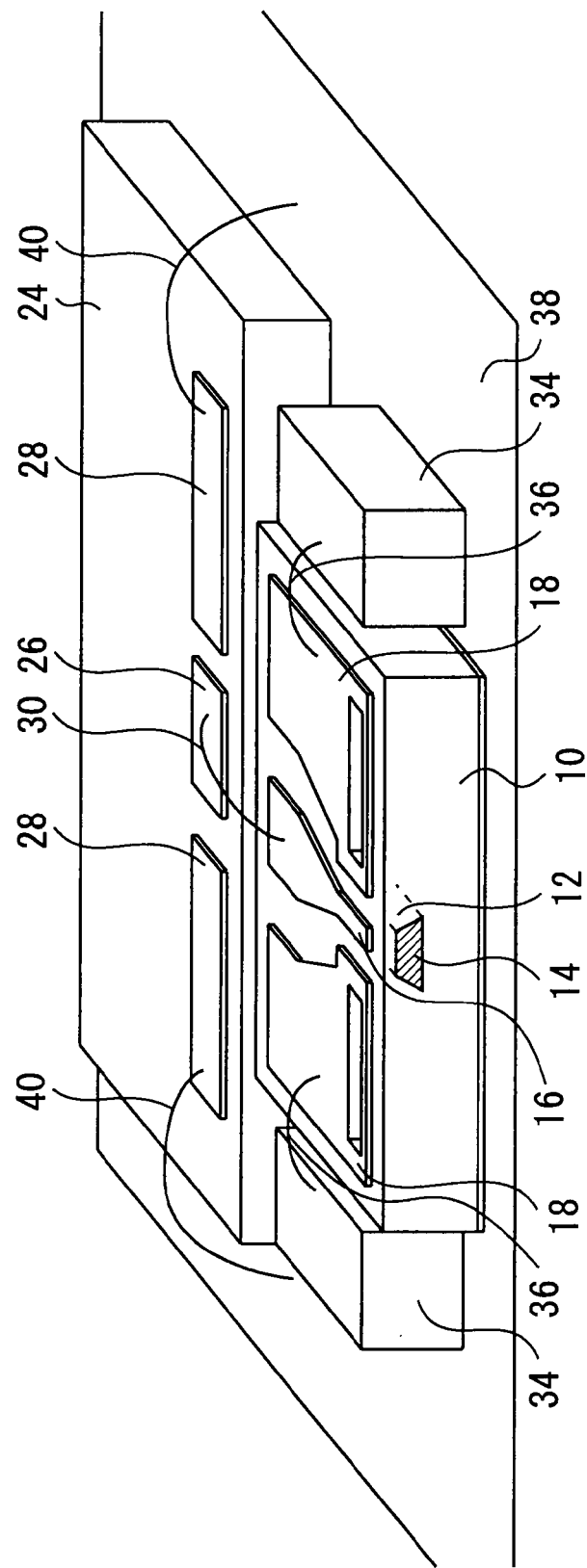
FIG. 3 is a perspective view showing a state where a light receiving element according to a comparative example is connected to an integrated circuit.

The advantages of the light receiving element of the present embodiment will be described by comparing it with a comparative example. FIG. 3 is a perspective view showing a state where a light receiving element according to the comparative example is connected to an integrated circuit. It should be noted that those components common to those shown in FIGS. 1 and 2 retain the same reference numerals and will not be further described.

In the comparative example, the insulating film 20 and the metal electrode 22 are not formed on the bias electrode 18. Alternatively, a capacitor 34 being a different part is formed on the bias electrode 18. The bias electrode 18 of the photodiode 10 side is connected to one end of the capacitor 34 by a wire 36. The other end of the capacitor 34 is connected to a substrate 38 including a reference potential. The bias electrode 28 of the integrated circuit 24 side is connected to the substrate 38 by a wire 40.

Figure 4:
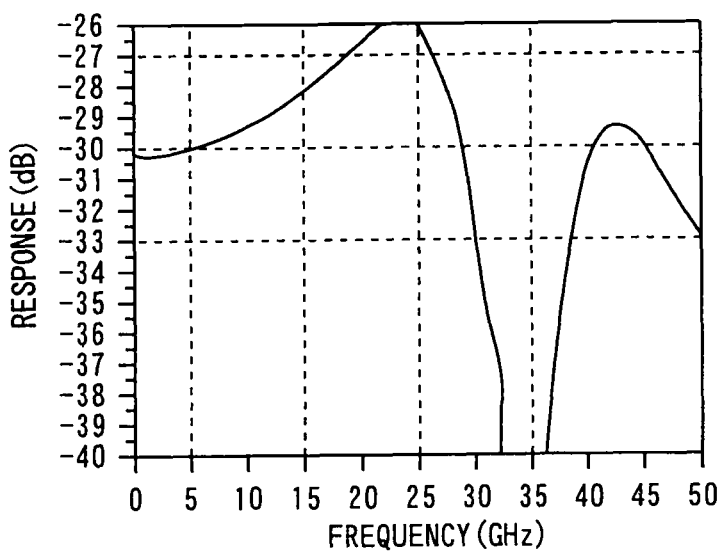
FIG. 4 is a view showing frequency responding characteristics from the light receiving element to the integrated circuit of FIG. 3.

In the comparative example, because the bias electrode 18 of the photodiode 10 side is connected to the bias electrode 28 of the integrated circuit 24 side via the capacitor 34 that is a different element, the electrical length between the two electrodes is long. Therefore, resonance occurs in the band as shown in FIG. 4.

Figure 5:
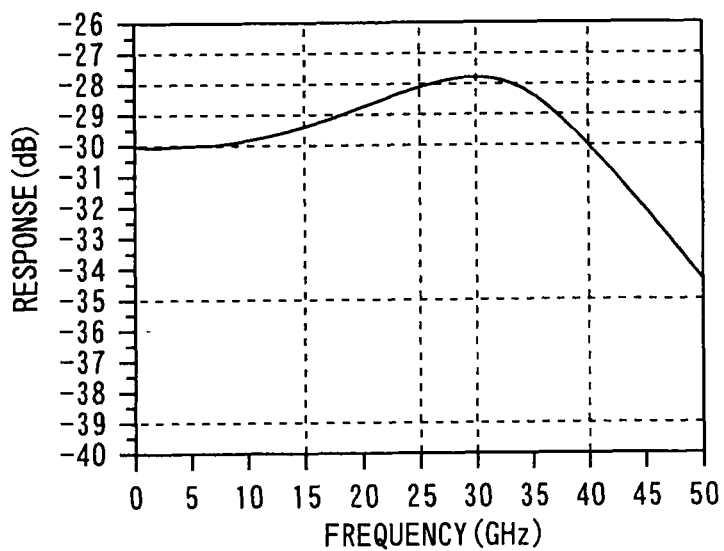
FIG. 5 is a view showing frequency responding characteristics from the light receiving element to the integrated circuit of FIG. 2.

On the other hand, in the first embodiment, because the thin capacitor is formed on the bias electrode 18 of the photodiode 10 side, the electrical length can be shortened. Therefore, because a distortion of an electric field coupling caused by resonance can be reduced as shown in FIG. 5, signals can be transmitted over a broad band.

Second Embodiment

Figure 6:
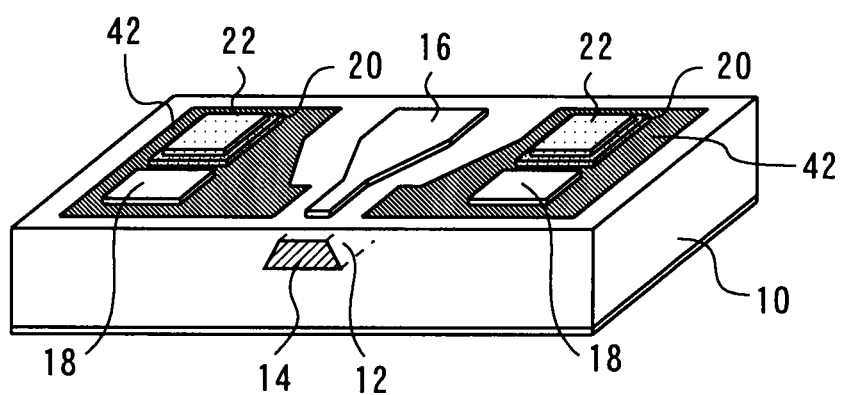
FIG. 6 is a perspective view showing a light receiving element according to a second embodiment of the present invention.

FIG. 6 is a perspective view showing a light receiving element according to a second embodiment of the present invention. It should be noted that those components common to those shown in FIG. 1 retain the same reference numerals and will not be further described.

An impurity diffused region 42 is formed in an upper surface of the photodiode 10. A bias electrode 18 is formed on the impurity diffused region 42. An insulating film 20 is formed on the impurity diffused region 42. A metal electrode 22 is formed on the insulating film 20. The insulating film 20 and the metal electrode 22 on the impurity diffused region 42 constitute a thin capacitor in the same manner as in the first embodiment. Thereby, the effect similar to the effect of the first embodiment can be obtained. Furthermore, the bias electrode 18 and the metal electrode 22 can be formed by the same process.

Third Embodiment

Figure 7:
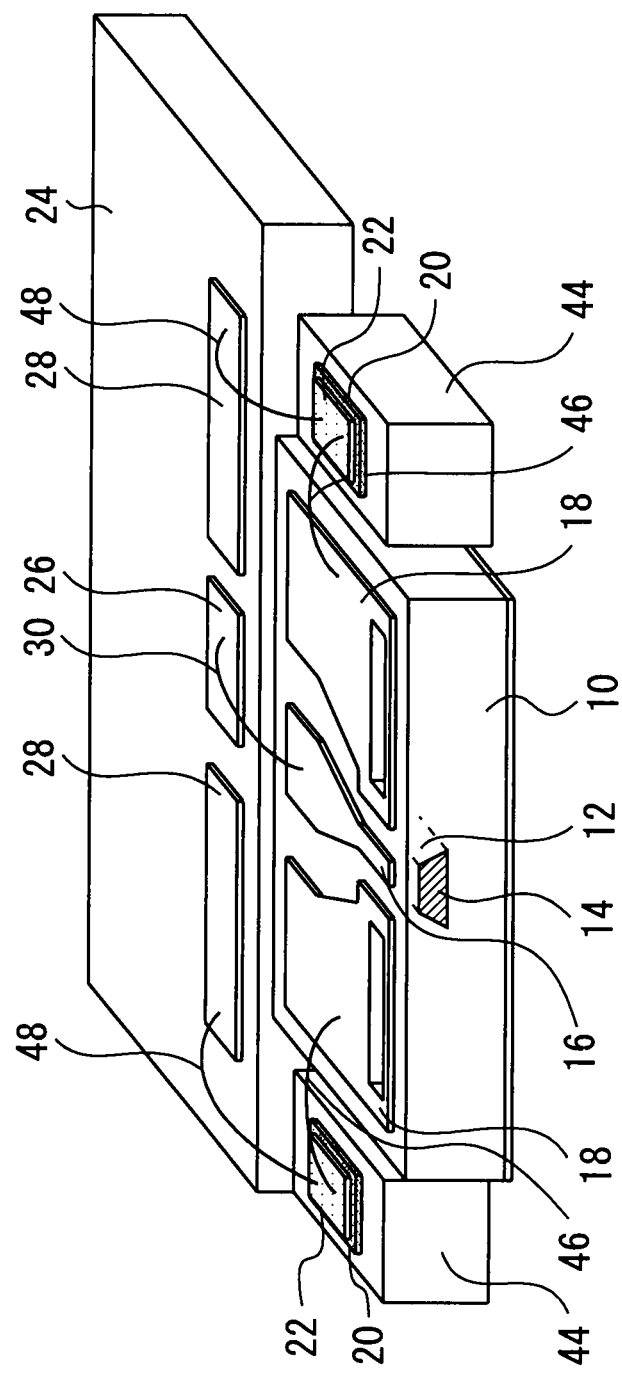
FIG. 7 is a perspective view showing a state where a light receiving element according to a third embodiment of the present invention is connected to an integrated circuit.

FIG. 7 is a perspective view showing a state where a light receiving element according to a third embodiment of the present invention is connected to an integrated circuit. It should be noted that those components common to those shown in FIGS. 1 and 2 retain the same reference numerals and will not be further described.

A substrate 44 having a reference potential is provided. An insulating film 20 is formed on the substrate 44. A metal electrode 22 is formed on the insulating film 20. A bias electrode 18 of the photodiode 10 side is connected to a metal electrode 22 by a wire 46. A bias electrode 28 of the integrated circuit 24 side is connected to the substrate 44 by a wire 48. The insulating film 20 and the metal electrode 22 on the substrate 44 constitute a thin capacitor in the same manner as in the first embodiment. Thereby, the effect similar to the effect of the first embodiment can be obtained.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2008-231073, filed on Sep. 9, 2008 including specification, claims, drawings and summary, on which the Convention priority of the present application is based, are incorporated herein by reference in its entirety.

What is claimed is:

1. A light receiving element comprising:
a photodiode including an optical waveguide, an end surface of the optical waveguide being a light receiving surface of the photodiode;
a signal electrode and a first bias electrode on a common surface of the photodiode, the signal electrode being connected to an anode of the photodiode, the first bias electrode being connected to a cathode of the photodiode;
an insulating film on the first bias electrode;
a metal electrode on the insulating film; and
a wiring to connect the metal electrode directly to a second bias electrode on an integrated circuit;
wherein a return current flows through the first bias electrode and only high frequency components of the return current are fed to the second bias electrode via the insulating film, the metal electrode, and the wiring.

2. A light receiving element comprising:
a photodiode including an optical waveguide, an end surface of the optical waveguide being a light receiving surface of the photodiode;
a signal electrode on an upper surface of the photodiode, the signal electrode being connected to an anode of the photodiode;
an impurity diffused region in the upper surface of the photodiode;
a first bias electrode on the impurity diffused region, the first bias electrode being connected to a cathode of the photodiode;
an insulating film on the impurity diffused region;
a metal electrode on the insulating film;
a wiring to connect the metal electrode directly to a second bias electrode on an integrated circuit;
wherein a return current flows through the first bias electrode and only high frequency components of the return current are fed to the second bias electrode via the insulating film, the metal electrode, and the wiring.

3. A light receiving element comprising:
a photodiode including an optical waveguide, an end surface of the optical waveguide being a light receiving surface of the photodiode;
a signal electrode and a first bias electrode on a common surface of the photodiode, the signal electrode being connected to an anode of the photodiode, the first bias electrode being connected to a cathode of the photodiode;
a substrate including a reference potential;
an insulating film on the substrate;
a metal electrode on the insulating film;
a wire connecting the first bias electrode to the metal electrode;
wherein a return current flows through the first bias electrode and only high frequency components of the return current are fed to the second bias electrode via the insulating film, the metal electrode, and the wiring.

* * * * *